(12) United States Patent
Su et al.

(10) Patent No.: US 11,916,141 B2
(45) Date of Patent: Feb. 27, 2024

(54) METHOD FOR FABRICATING SHIELD GATE MOSFET

(71) Applicant: Powerchip Semiconductor Manufacturing Corporation, Hsinchu (TW)

(72) Inventors: Hung-I Su, Hsinchu (TW); Chang-Chin Ho, Hsinchu (TW); Yong-Kang Jiang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 41 days.

(21) Appl. No.: 17/505,662

(22) Filed: Oct. 20, 2021

(65) Prior Publication Data
US 2022/0045210 A1    Feb. 10, 2022

Related U.S. Application Data

(62) Division of application No. 16/663,365, filed on Oct. 25, 2019, now abandoned.

(30) Foreign Application Priority Data

Jul. 16, 2019   (TW) ................................. 108125082

(51) Int. Cl.
*H01L 29/78* (2006.01)
*H01L 29/66* (2006.01)
(Continued)

(52) U.S. Cl.
CPC ...... *H01L 29/7813* (2013.01); *H01L 29/0623* (2013.01); *H01L 29/407* (2013.01); *H01L 29/66734* (2013.01)

(58) Field of Classification Search
CPC ............ H01L 29/7813; H01L 29/7825; H01L 29/66613–66628; H01L 29/42336;
(Continued)

(56) References Cited

U.S. PATENT DOCUMENTS 9,812,564 B1    11/2017 Liu et al.
9,953,969 B2 *  4/2018 Hsieh .................. H01L 27/0255
(Continued)

OTHER PUBLICATIONS

"Office Action of China Counterpart Application", dated Sep. 20, 2023, p. 1-p. 9.

*Primary Examiner* — Younes Boulghassoul
*Assistant Examiner* — Quinton A Brasfield
(74) *Attorney, Agent, or Firm* — JCIPRNET

(57) ABSTRACT

A method for fabricating a shield gate MOSFET includes forming an epitaxial layer having a first conductivity type, forming a plurality of trenches in the epitaxial layer, forming a first and a second doped regions in the epitaxial layer at a bottom of each of the trenches, wherein the first doped region has a second conductivity type, and the second doped region has the first conductivity type. An insulating layer and a conductive layer as a shield gate are orderly formed in each of the trenches, and a portion of the conductive layer and the insulating layer are removed to expose a portion of the epitaxial layer in the trenches. An inter-gate oxide layer and a gate oxide layer are formed in the trenches, and a control gate is formed on the inter-gate oxide layer in the plurality of trenches.

5 Claims, 9 Drawing Sheets

(51) Int. Cl.
*H01L 29/40* (2006.01)
*H01L 29/06* (2006.01)

(58) Field of Classification Search
CPC ......... H01L 29/42352; H01L 29/42356; H01L 29/4236; H01L 29/404; H01L 29/407
See application file for complete search history.

(56) References Cited

U.S. PATENT DOCUMENTS

| | | | |
|---|---|---|---|
| 10,998,438 B2 * | 5/2021 | Yilmaz | H01L 29/7806 |
| 11,011,606 B2 * | 5/2021 | Meiser | H01L 29/66924 |
| 11,538,911 B2 * | 12/2022 | Yilmaz | H01L 29/66348 |
| 2011/0244641 A1 * | 10/2011 | Pan | H01L 29/66727 |
| | | | 438/270 |
| 2016/0359029 A1 * | 12/2016 | Zeng | H01L 29/0834 |
| 2017/0194486 A1 | 7/2017 | Venkatraman et al. | |
| 2019/0259870 A1 * | 8/2019 | Meiser | H01L 29/7391 |
| 2020/0044078 A1 * | 2/2020 | Yilmaz | H01L 29/4236 |
| 2020/0350400 A1 * | 11/2020 | Lee | H01L 29/66727 |

\* cited by examiner

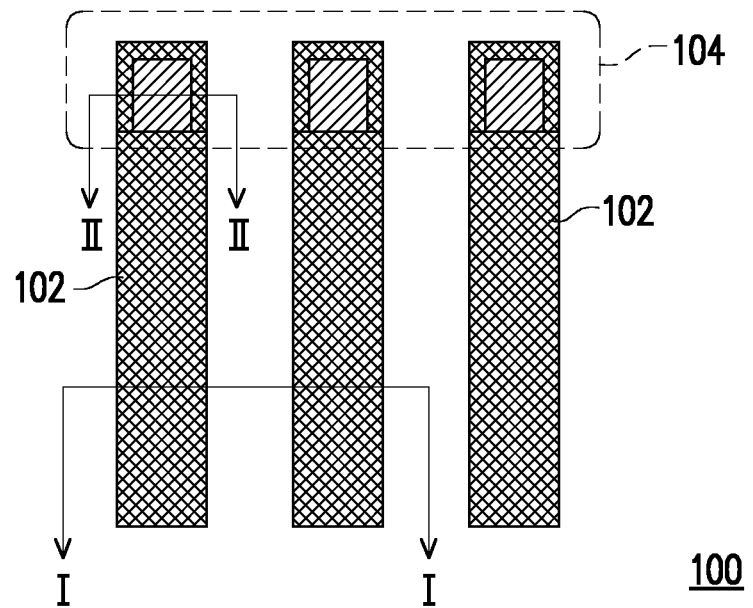
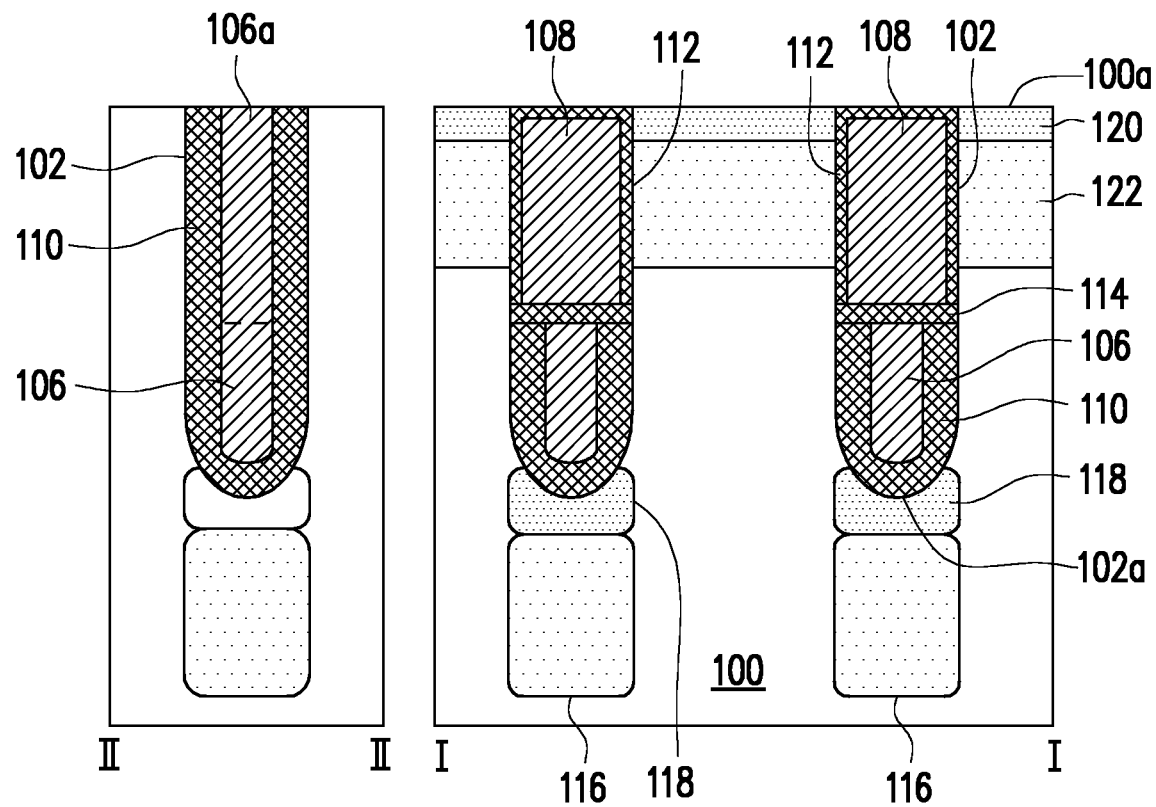
FIG. 1A
FIG. 1B

METHOD FOR FABRICATING SHIELD GATE MOSFET

CROSS-REFERENCE TO RELATED APPLICATION

This application is a divisional application of and claims the priority benefit of U.S. patent application Ser. No. 16/663,365, filed on Oct. 25, 2019, now pending. The prior application Ser. No. 16/663,365 claims the priority benefit of Taiwan application serial no. 108125082, filed on Jul. 16, 2019. The entirety of the above-mentioned patent applications is hereby incorporated by reference herein and made a part of this specification.

BACKGROUND

Technical Field

The disclosure relates to a semiconductor structure and a method for fabricating the same, and more particularly, to a method for fabricating a shield gate MOSFET.

Description of Related Art

The shield gate MOSFET is an improved structure of the trench gate MOS structure. Compared with the conventional MOS structure, the shield gate MOSFET may effectively reduce the capacitance of the gate to the drain ($C_{gd}$), thereby improving switching loss. With advancements in terminal consumer products, there is still a great need in related industries for novel semiconductor structures that may further improve the performance of various components.

However, as components get smaller and operating voltage is increased, there is a need to seek a technical solution to increase component breakdown voltage.

SUMMARY OF THE DISCLOSURE

The disclosure provides a method for fabricating a shield gate MOSFET, which may be integrated into an existing process to produce a shield gate MOSFET with improved drain-source breakdown voltage ($BVD_{SS}$) and high breakdown voltage.

A method for fabricating a shield gate MOSFET of the disclosure includes the following steps. An epitaxial layer having a first conductivity type is formed. A plurality of trenches is formed in the epitaxial layer. A first doped region having a second conductivity type and a second doped region having the first conductivity type are sequentially formed in the epitaxial layer at a bottom of each trench. An insulating layer is formed on a surface of the epitaxial layer in each trench. A conductive layer is formed on the insulating layer in each trench. A portion of the conductive layer is removed to form a shield gate and expose a portion of the insulating layer. The exposed portion of the insulating layer is removed and exposes a portion of the epitaxial layer in the trenches. An inter-gate oxide layer and a gate oxide layer are formed in the trenches, wherein the inter-gate oxide layer covers a top surface of the shield gate, and the inter-gate oxide layer covers the surface of the exposed portion of the epitaxial layer. A control gate is formed on the inter-gate oxide layer in the trenches.

In an embodiment of the disclosure, the first conductivity type is N type and the second conductivity type is P type.

In an embodiment of the disclosure, the first conductivity type is P type and the second conductivity type is N type.

In an embodiment of the disclosure, after the portion of the conductive layer is removed, the top surface of the shield gate may be further rounded.

In an embodiment of the disclosure, the fabricating method may further include forming a source region on the surface of the epitaxial layer, and a doping concentration of the second doped region is less than a doping concentration of the source region.

In an embodiment of the disclosure, a doping concentration of the first doped region is a uniform concentration.

In an embodiment of the disclosure, the epitaxial layer includes a connecting region, and thus when the trenches are formed, the trenches are also formed in the connecting region, and before the step of removing a portion of the conductive layer, a protective layer may be formed on the connecting region to keep the conductive layer in the connecting region.

Based on the above, in the disclosure, the first and second doped regions having different conductivity types are formed in the epitaxial layer at the bottom of the trenches, and therefore the first doped region having a different conductivity type than the epitaxial layer may provide a uniform field distribution, and the second doped region having the same conductivity type as the epitaxial layer is located between the first doped region and the bottom of the trenches to reduce leakage path, thereby improving drain-source breakdown voltage.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A is a top view of a shield gate MOSFET according to the first embodiment of the disclosure.

FIG. 1B is a cross section of the structure of the I-I line segment and the II-II line segment of FIG. 1A.

DESCRIPTION OF THE EMBODIMENTS

Figure 2:
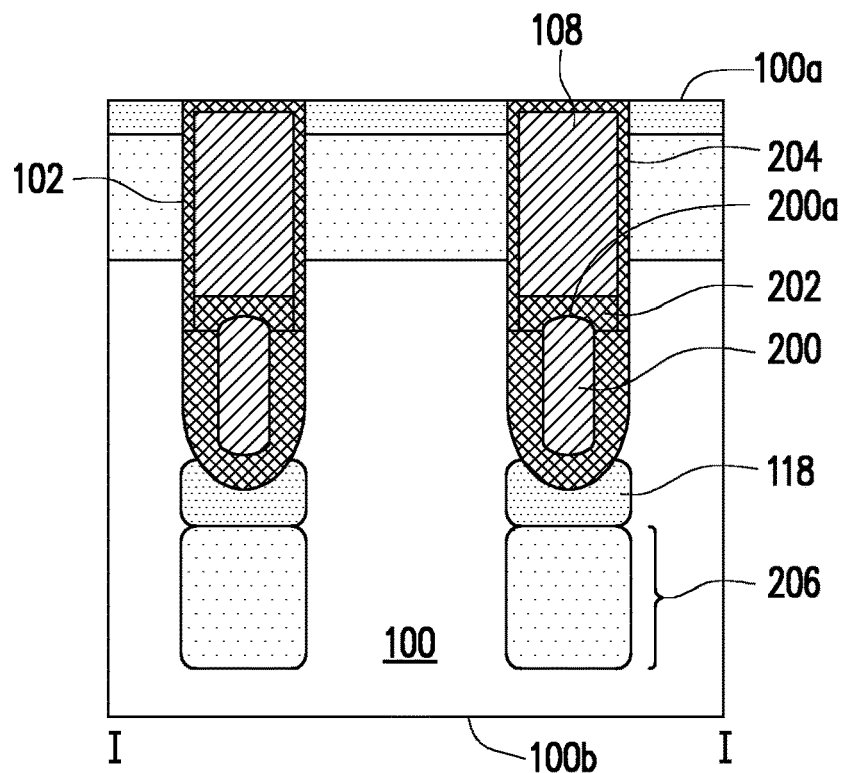
FIG. 2 is a cross section of another shield gate MOSFET of the first embodiment.

The figures in the following embodiments are intended to more comprehensively describe the exemplary embodiments of the inventive concept, but the disclosure may still be implemented in many different forms, and the disclosure should not be construed as limited to the recited embodiments. In the figures, for clarity, the relative thickness and location of film layers, regions, and/or structural elements may be reduced or enlarged. Moreover, in the present specification, "first", "second", "third" . . . etc. are used to describe different regions, film layers, and/or blocks, but such terms are only intended to differentiate a region, film layer, or block from another region, film layer, or block. Therefore, a first region, film layer, or block discussed below may be referred to as a second region, film layer, or block without compromising the teaching of the embodiments. Moreover, the same or similar reference numerals represent the same or similar devices and are not repeated in the following paragraphs.

FIG. 1A is a top view of a shield gate MOSFET according to the first embodiment of the disclosure. FIG. 1B is a cross section of the structure of the I-I line segment and the II-II line segment of FIG. 1A.

Referring first to FIG. 1A, the shield gate MOSFET of the first embodiment is substantially formed in a plurality of trenches 102 in an epitaxial layer 100 having a first conductivity type. The area surrounded by the dashed circle is a connecting region 104 for connecting the circuits, but the disclosure is not limited thereto, and the connection of the circuits may be performed by known art to omit the connecting region 104.

Referring to both FIG. 1A and FIG. 1B, the shield gate MOSFET of the present embodiment includes an epitaxial layer 100, trenches 102 formed in the epitaxial layer 100, a shield gate 106 located in the trenches 102, a control gate 108 located on the shield gate 106 in the trenches 102, an insulating layer 110 located between the shield gate 106 and the epitaxial layer 100, a gate oxide layer 112 located between the control gate 108 and the epitaxial layer 100, an inter-gate oxide layer 114 located between the shield gate 106 and the control gate 108, a first doped region 116 located in the epitaxial layer 100 of a trench bottom 102a, and a second doped region 118 located between the trench bottom 102a and the first doped region 116. In particular, the first doped region 116 has a second conductivity type, and the second doped region 118 has the first conductivity type. That is, the second doped region 118 and the epitaxial layer 100 have the same conductivity type, and the first doped region 116 and the epitaxial layer 100 have different conductivity types. In an embodiment, the first conductivity type is N type and the second conductivity type is P type. In another embodiment, the first conductivity type is P type and the second conductivity type is N type. In the present embodiment, the doping concentrations of the first doped region 116 and the second doped region 118 may be different uniform concentrations, respectively. The depth of the second doped region 118 is, for example, less than 0.5 µm, and the depth of the first doped region 116 is, for example, between 0.5 µm and 1.5 µm, and the depth range of the first doped region 116 depends on the range of the second doped region 118. The "depth" in the specification is calculated from the trench bottom 102a, so if the depth of the second doped region 118 is 0.5 µm, the distribution of the second doped region 118 ranges from the trench bottom 102a to 0.5 µm below. However, the disclosure is not limited thereto, and the depths of the first doped region 116 and the second doped region 118 may also be adjusted once the size design of the shield gate MOSFET or the voltage value $V_{DG}$ is changed.

Also shown in FIG. 1B is a well region 122 disposed in the source region 120 of an epitaxial layer surface 100a and adjacent to the source region 120, wherein the source region 120 has the first conductivity type and the well region 122 has the second conductivity type. In an embodiment, the doping concentration of the second doped region 118 is less than the doping concentration of the source region 120.

Referring to FIG. 1A and FIG. 1B simultaneously, if the epitaxial layer 100 has the connecting region 104, then the structure therein may include the trenches 102 extended to the connecting region 104, the shield gate 106 extended into the trenches 102 in the connecting region 104, and a protruding portion 106a. The protruding portion 106a may be used as a contact for electrically connecting the shield gate 106 and is formed by keeping the shield gate 106 of the connecting region 104 via a process. In this configuration, the control gate 108 is not extended to connecting region 104.

FIG. 2 is a cross section of another shield gate MOSFET of the first embodiment, wherein the same or similar components are represented by the same reference numerals as in FIG. 1B, and the same or similar components are also as provided above and are not repeated herein.

In FIG. 2, a top surface 200a of a shield gate 200 covered by an inter-gate oxide layer 202 has rounded corners to improve the deposition quality of the inter-gate oxide layer 202 above. Moreover, depending on the process sequence, for example, thermal oxidation is performed first to form a gate oxide layer 204, and then the denser inter-gate oxide layer 202 is deposited such that some of the positions of the inter-gate oxide layer 202 and the gate oxide layer 204 are different from those in FIG. 1B.

FIG. 3A to FIG. 3L are cross sections of a process for fabricating a shield gate MOSFET according to the second embodiment of the disclosure, and the top view of the second embodiment corresponds to the structure of FIG. 1A.

Figure 3A:
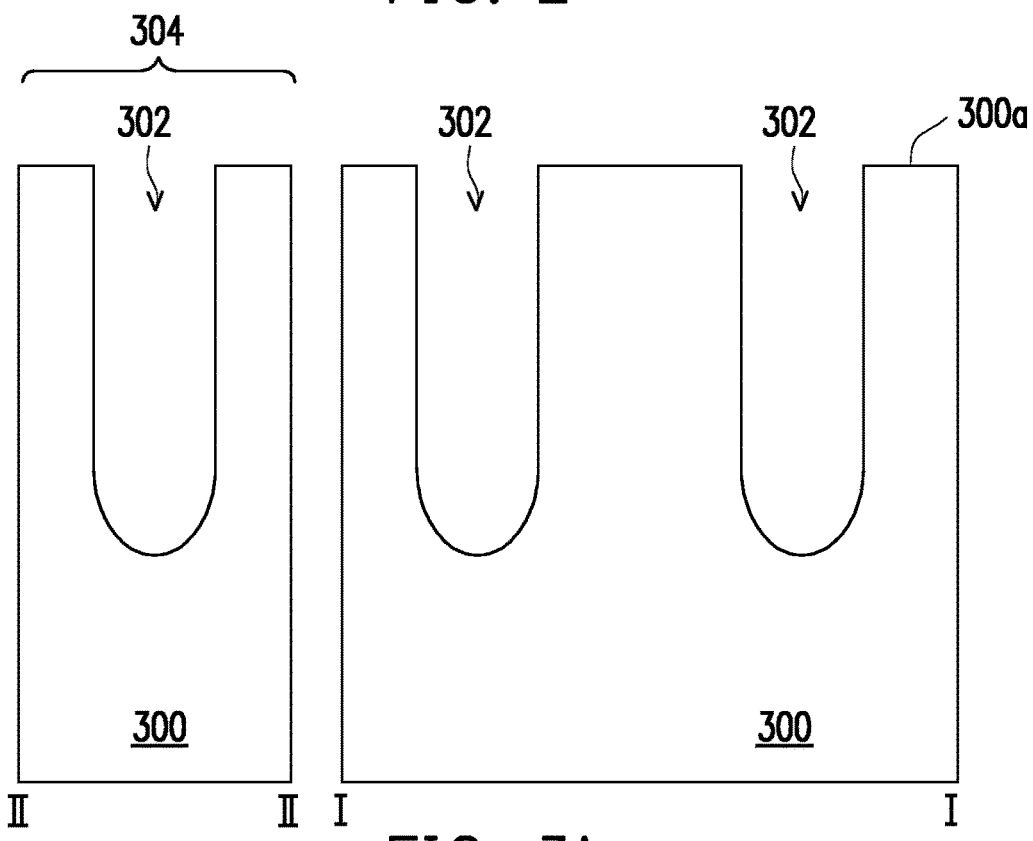
FIG. 3A to FIG. 3L are cross sections of a fabricating process of a shield gate MOSFET according to the second embodiment of the disclosure.

Referring first to FIG. 3A, the method of the second embodiment includes first forming an epitaxial layer 300 having the first conductivity type and then forming a plurality of trenches 302 in the epitaxial layer 300. The method of forming the epitaxial layer 300 usually includes forming the epitaxial layer 300 on a substrate (not shown) by an epitaxial process. Subsequently, a patterned mask layer (not shown) is formed on an epitaxial layer surface 300a to define the positions of the trenches 302, and then the patterned mask layer is used as a mask to etch the epitaxial layer 300 to obtain the plurality of trenches 302 shown in the figure. Moreover, while the trenches 302 are formed, the trenches 302 are also formed in a connecting region 304 of the epitaxial layer 300. However, the disclosure is not limited thereto, and the second embodiment may not have the connecting region 304; alternatively, other isolation structures may be provided in addition to the connecting region 304, and therefore the trenches 302 may also be formed outside the connecting region 304 as trenches for other isolation structures.

Figure 3B:
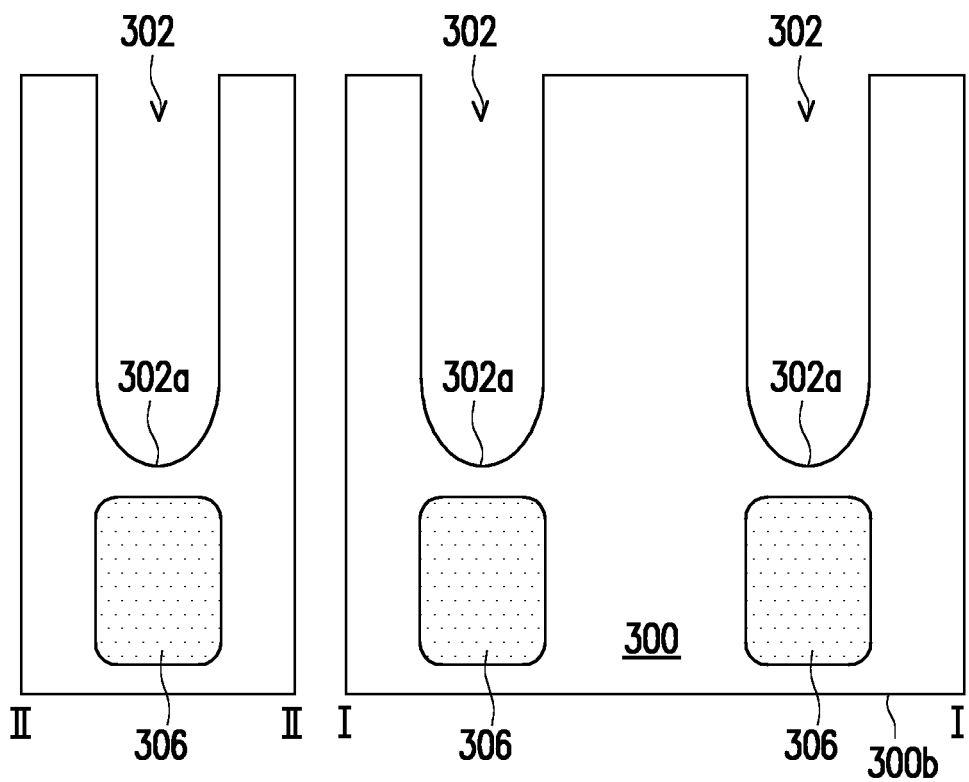

Referring next to FIG. 3B, a first doped region 306 having a second conductivity type is formed in the epitaxial layer 300 of each trench bottom 302a. Generally, the method of forming the first doped region 306 includes performing an ion implantation process on the epitaxial layer 300 without removing the patterned mask layer (not shown), and a dopant having the second conductivity type is implanted and a thermal process is used to drive the dopant. In the present embodiment, the first conductivity type is N type and the second conductivity type is P type. In another embodiment, the first conductivity type is P type and the second conductivity type is N type. The doping concentration of the first doped region 306 may be a uniform concentration; alternatively, the method of forming the first doped region 306 may also be multi-stage doping so that the doping concentration of the first doped region 306 is a trapezoidal concentration gradually increasing from the end of the trenches 302 to an epitaxial layer bottom surface 300b as shown in FIG. 2.

Figure 3C:
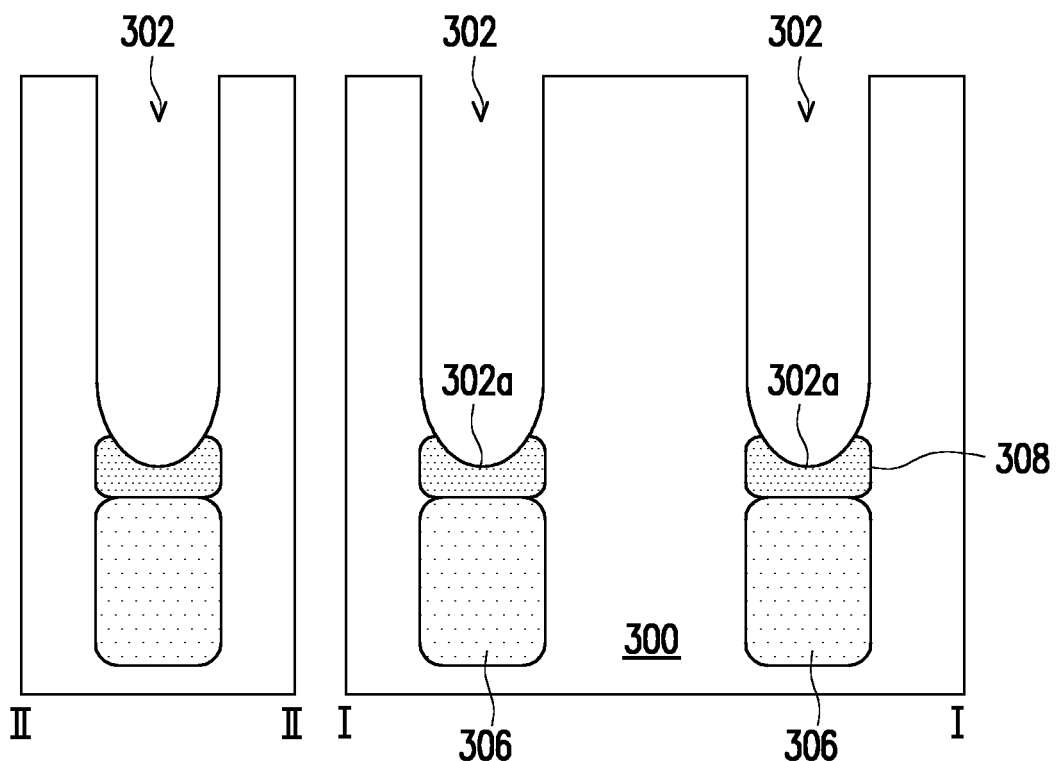

Thereafter, referring to FIG. 3C, a second doped region 308 having the first conductivity type is formed in the epitaxial layer 300 between the first doped region 306 and the trench bottom 302a. The method of forming the second doped region 308 includes, for example, performing another ion implantation process on the epitaxial layer 300 without removing the patterned mask layer (not shown), and a dopant having the first conductivity type is implanted and a thermal process is used to drive the dopant. Therefore, the second doped region 308 is formed between the trench bottom 302a and the first doped region 306. The exemplary depth range and concentration range of the first doped region 306 and the second doped region 308 are as provided in the first embodiment and are therefore not repeated herein.

Next, in order to form a MOSFET having a shield gate in each trench 302, the following process may be performed, but the scope of the disclosure is not limited to the following steps. Depending on design requirements, there may be additional steps or some steps omitted.

Figure 3D:
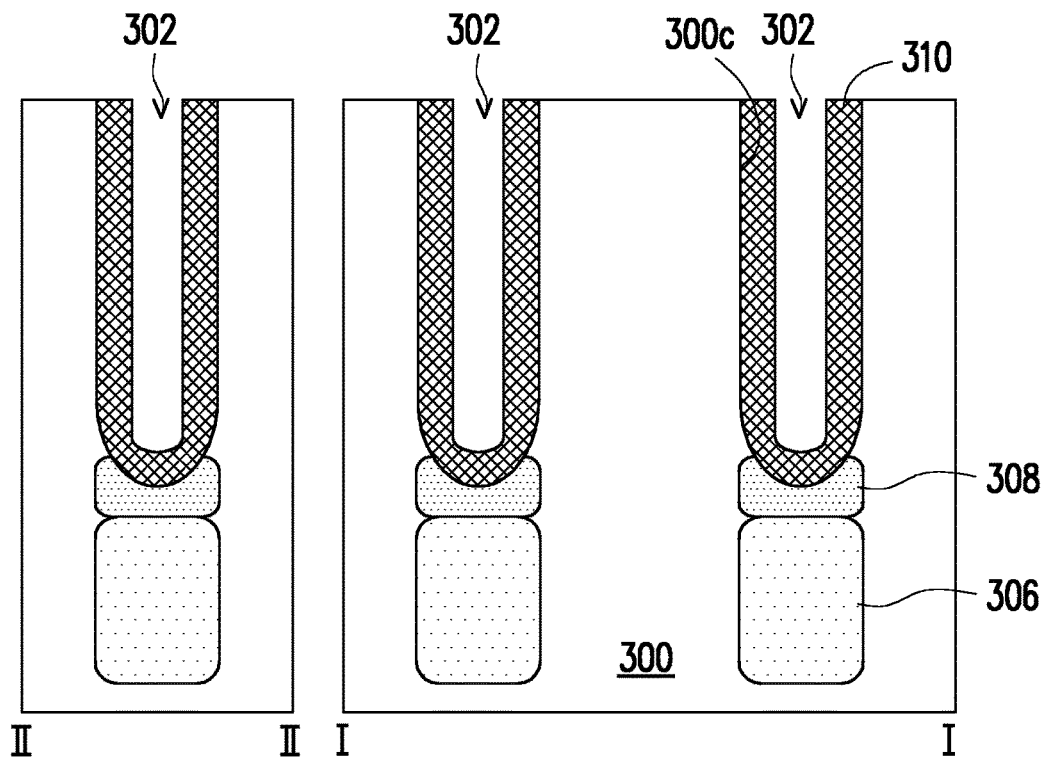

Referring first to FIG. 3D, an insulating layer 310 is formed on an epitaxial layer surface 300c in each trench 302, and the forming of the insulating layer 310 includes, for example, forming a thick oxide layer by a thermal oxidation process to increase breakdown voltage.

Figure 3E:
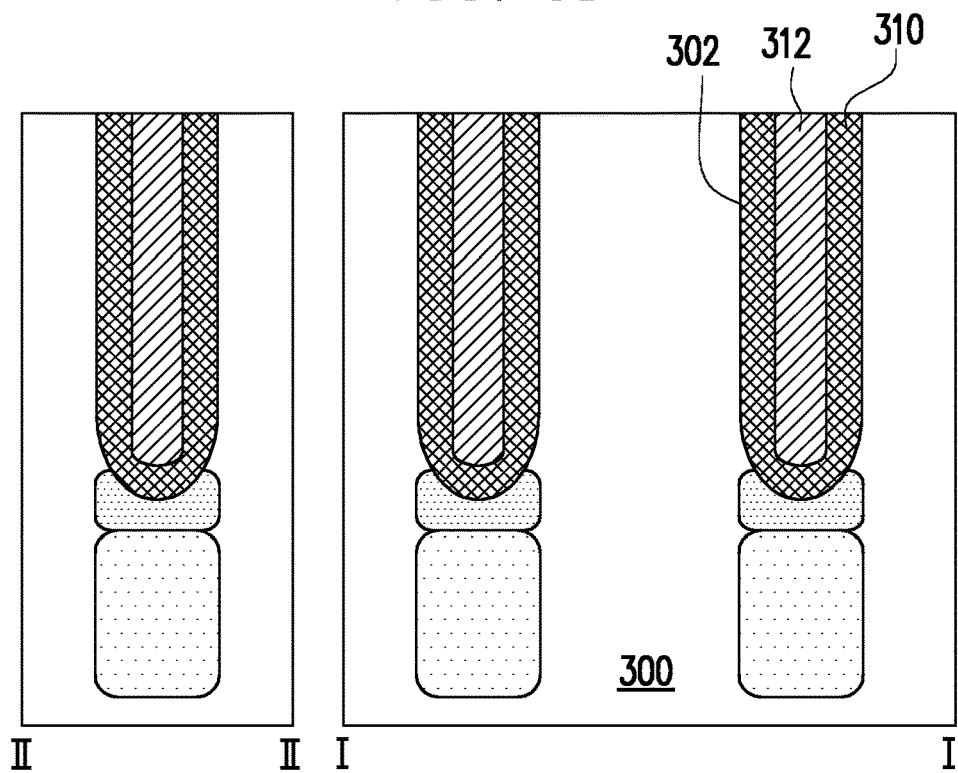

Referring next to FIG. 3E, a conductive layer 312 is formed on the insulating layer 310 in each of the trenches 302, and the conductive layer 312 is formed, for example, by depositing a conductive material (such as polysilicon) on the epitaxial layer 300, and then removing the conductive material outside the trenches 302 using a planarization process (e.g., CMP).

Figure 3F:
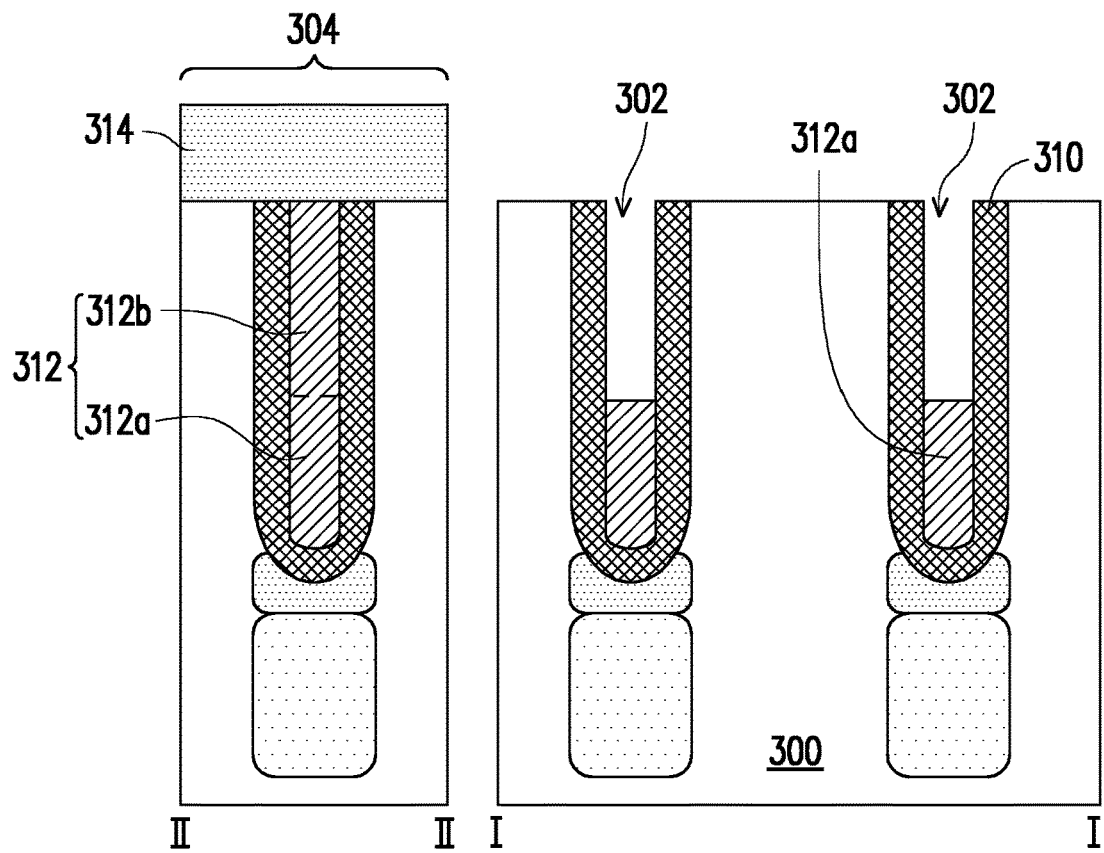

Referring next to FIG. 3F, a portion of the conductive layer 312 is removed to form a shield gate 312a and expose a portion of the insulating layer 310, and the removal method is, for example, dry etching or directional wet etching. In addition, before the step of removing a portion of the conductive layer 312, a protective layer 314 may be formed on the connecting region 304 to keep the conductive layer 312 in the connecting region 304, including the shield gate 312a and a protruding portion 312b as a contact for subsequently electrically connecting the shield gate 312a.

Figure 3G:
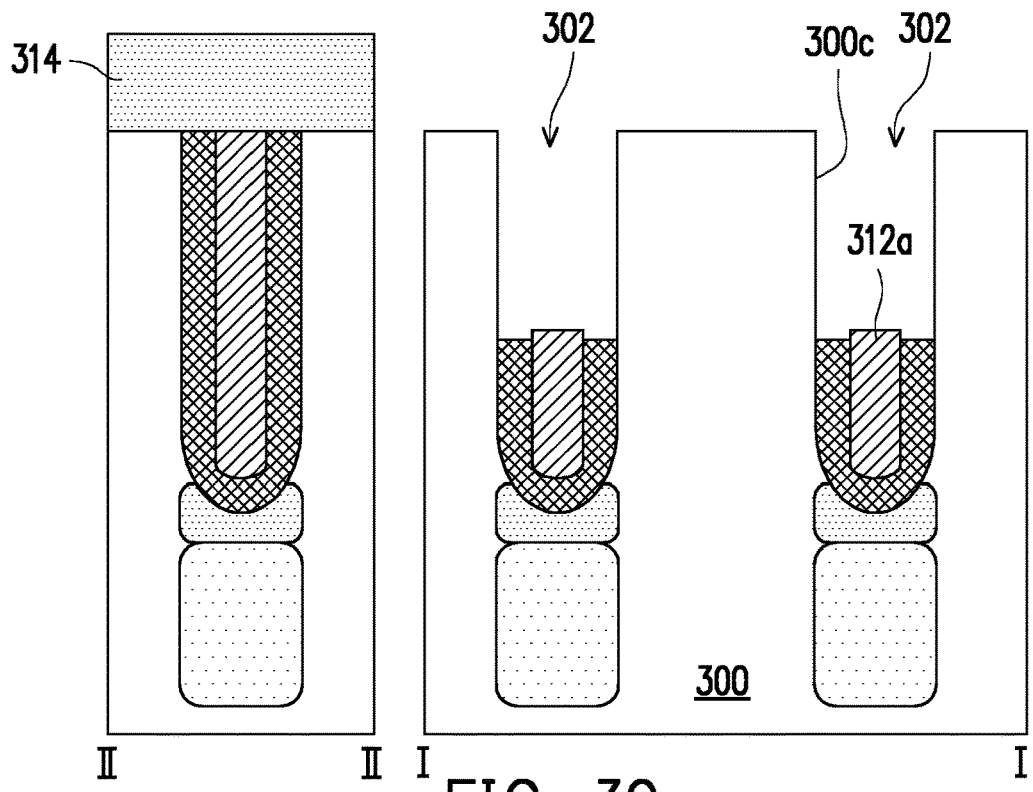

Next, referring to FIG. 3G, the exposed insulating layer 310 is removed to expose a portion of an epitaxial layer surface 300c in the trenches 302, and the insulating layer 310 may be slightly lower than the top surface of the shield gate 312a. The removal method is, for example, dry etching or wet etching.

Figure 3H:
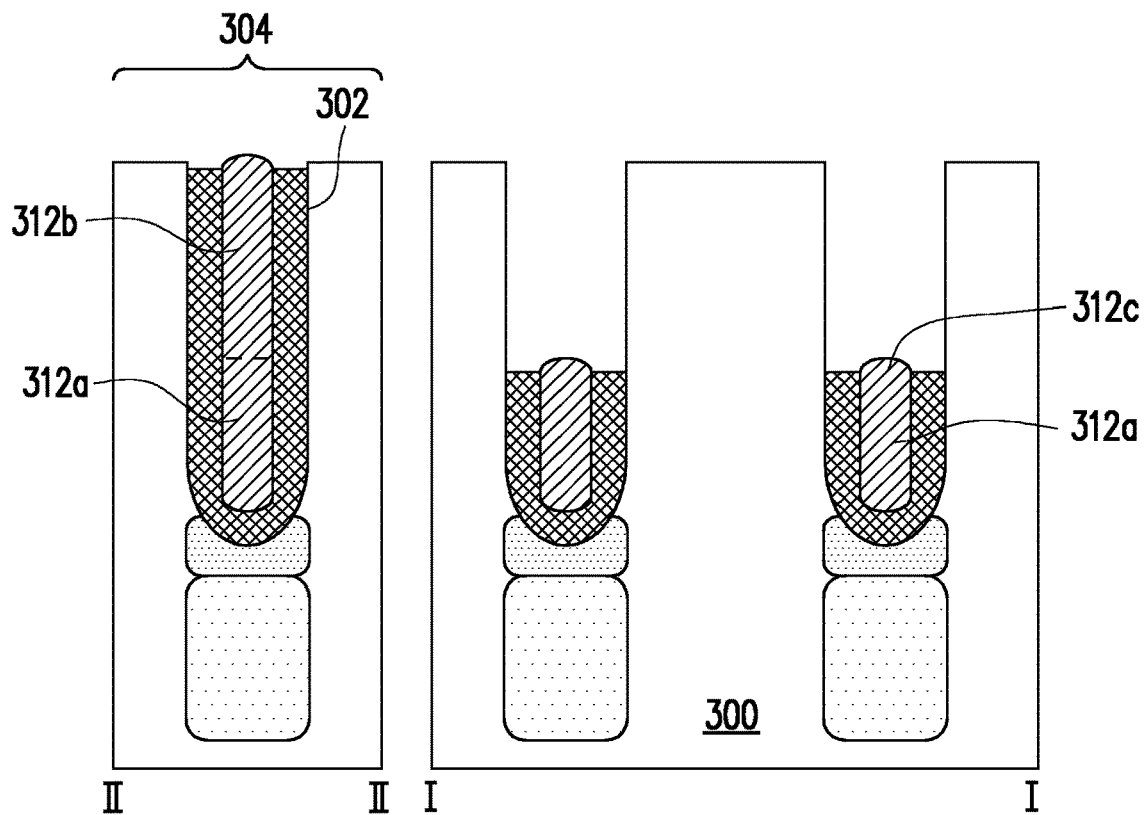

Referring next to FIG. 3H, in order to improve the quality of the subsequent deposited layer, the top surface of the shield gate 312a may be optionally rounded to obtain a slightly semicircular top surface 312c. The rounding process, for example, first oxidizes the top surface of the shield gate 312a and then removes the oxide there, wherein the removal method is, for example, wet dip. Moreover, the protective layer 314 of the connecting region 304 may be removed prior to the rounding, so that the top surface of the protruding portion 312b is also rounded and exposed by the trenches 302 of the connecting region 304.

Figure 3I:
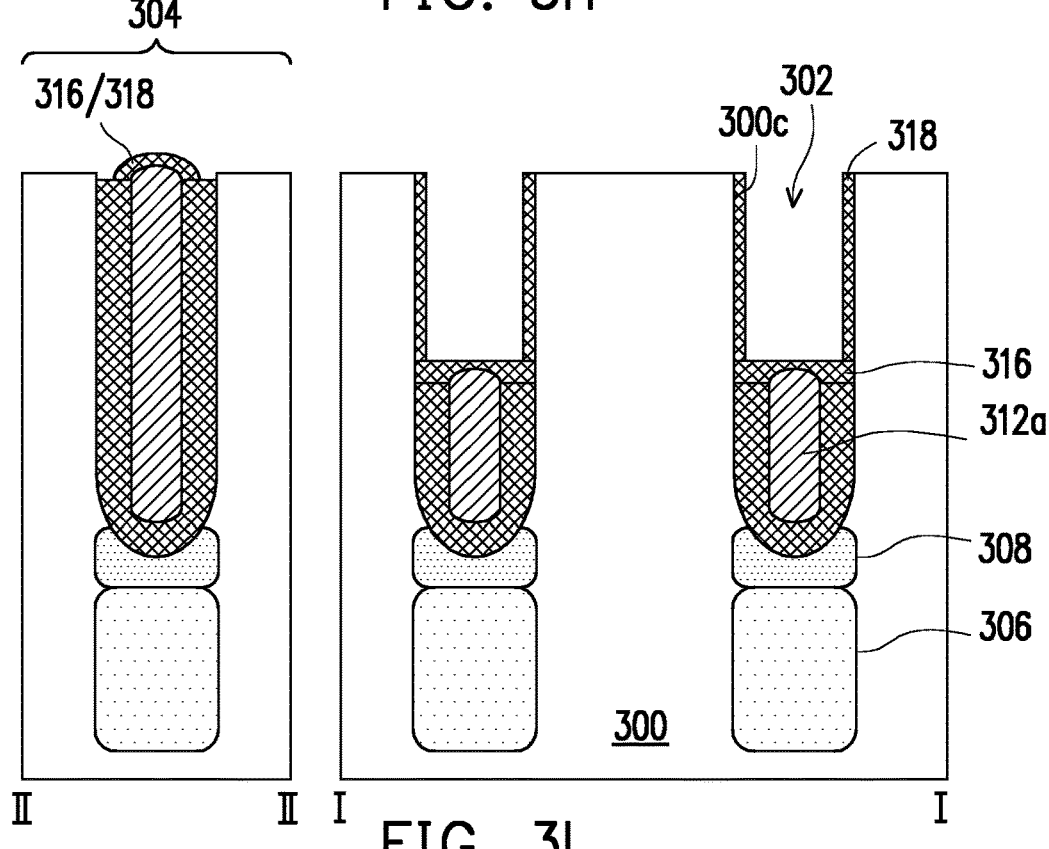

Referring next to FIG. 3I, an inter-gate oxide layer 316 and a gate oxide layer 318 are formed in the trenches 302, wherein the inter-gate oxide layer 316 covers the top surface 312c of the shield gate 312a, and the gate oxide layer 318 covers the epitaxial layer surface 300c in the trenches 302. Moreover, depending on the process sequence, for example, thermal oxidation is performed first to form the gate oxide layer 318, and then the denser inter-gate oxide layer 316 is deposited such that some of the positions of the inter-gate oxide layer 316 and the gate oxide layer 318 are different than in FIG. 3I. At this time, depending on the process sequence, the inter-gate oxide layer 316 or the gate oxide layer 318 may be formed on the surface of the protruding portion 312b of the connecting region 304, and the fabrication of subsequent connection is only performed after the MOSFET is formed.

Figure 3J:
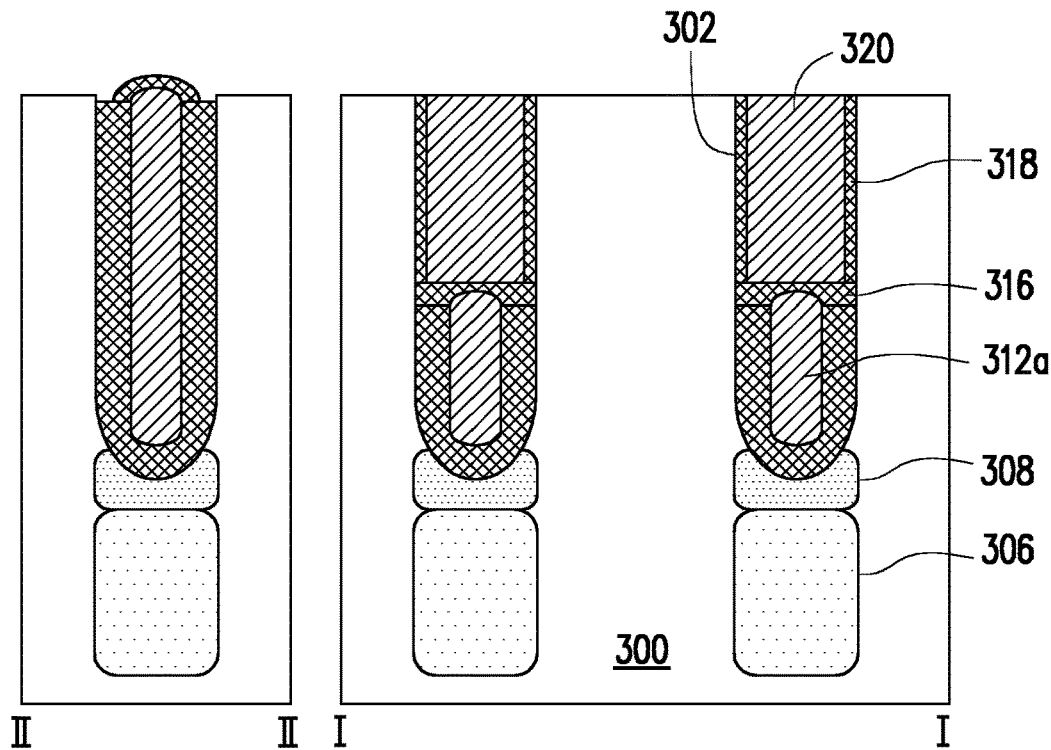

Next, referring to FIG. 3J, a control gate 320 is formed on the inter-gate oxide layer 316 in the trenches 302, and the forming of the control gate 320 includes, for example, depositing a layer of conductive material (such as polysilicon) on the epitaxial layer 300, and then removing the conductive material outside the trenches 302 using a planarization process (such as CMP) to complete the MOSFET having the shield gate 312a.

Figure 3K:
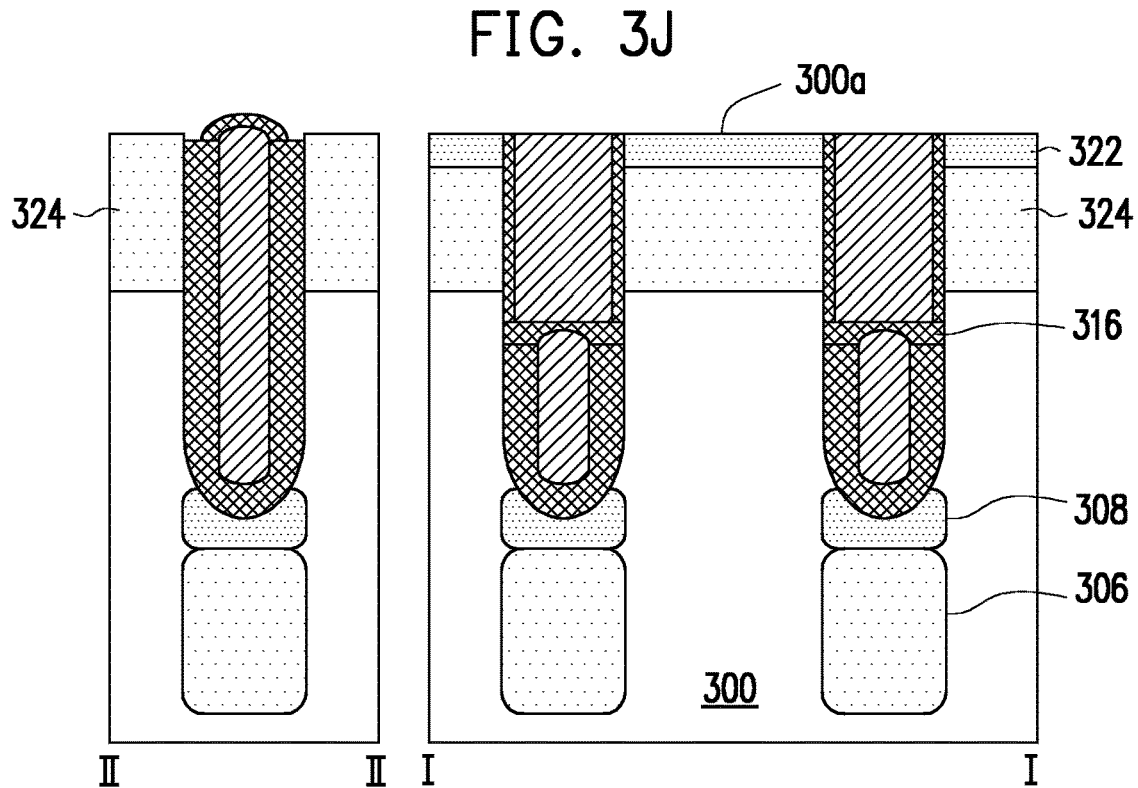

Then, referring to FIG. 3K, a source region 322 may be formed on the epitaxial layer surface 300a, and the source region 322 has the first conductivity type. In an embodiment, the doping concentration of the second doped region 308 is less than the doping concentration of the source region 322. A well region 324 may also be formed in the epitaxial layer 300. The well region 324 has the second conductivity type and is located under the source region 322 and above the gate oxide layer 316.

Figure 3L:
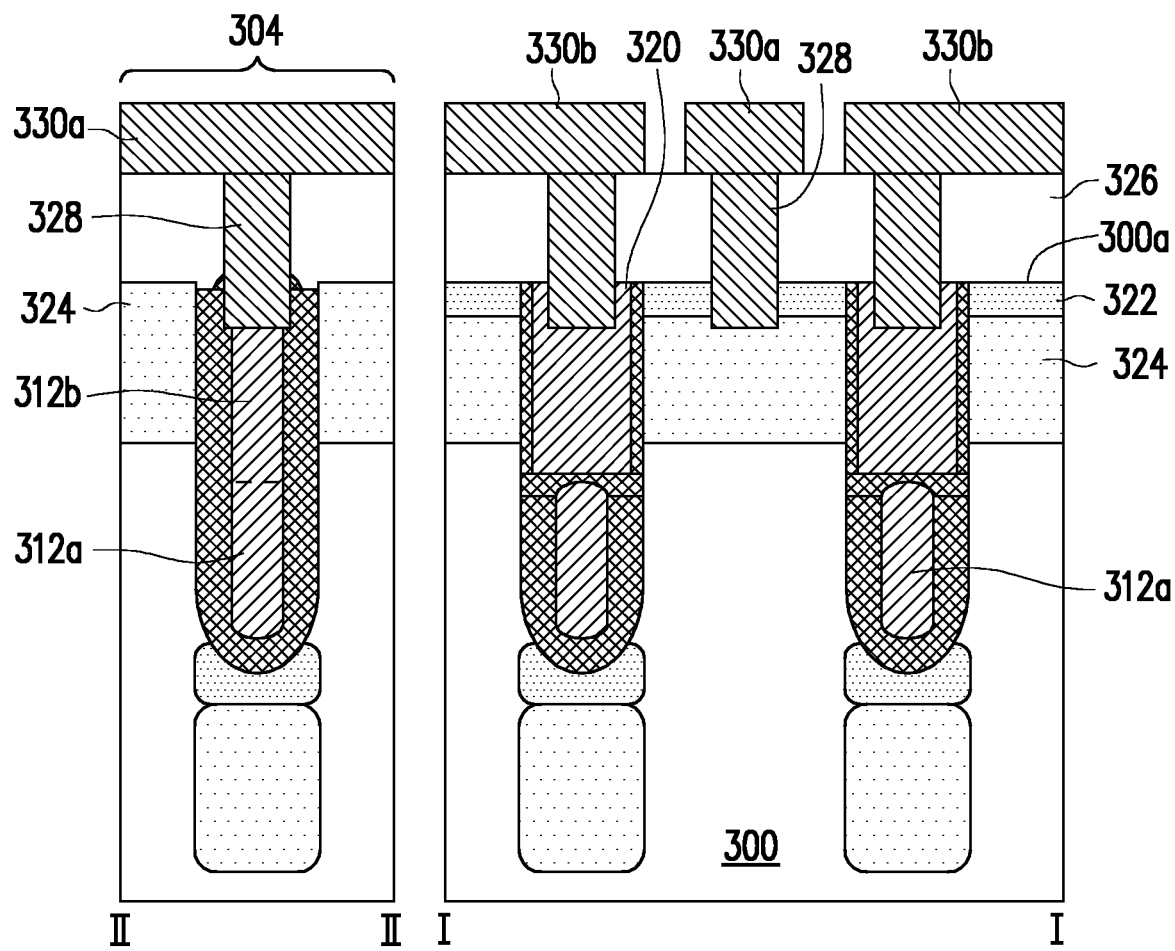

Finally, referring to FIG. 3L, a dielectric layer 326, a contact 328 in the dielectric layer 326, and different interconnects 330a and 330b connected to the contact 328 may be sequentially formed on the epitaxial layer surface 300a to perform the connecting process of the MOSFET. However, the disclosure is not limited thereto, and other prior art techniques may be employed.

Several experiments are described below to prove the efficacy of the disclosure. However, the scope of the disclosure is not limited to the following experimental content.

Simulation Experimental Example 1

The simulated structure is the shield gate MOSFET (EPI resistance is 0.35 Ω·cm/thickness 4 μm) shown in FIG. 1B, and a 150 V DG breakdown voltage is simulated, wherein the first doped region is P type, and the second doped region is N type, the doping dosage of the first doped region is a variable, and the depth is about 0.5 μm to 1.5 μm. The depth of the second doped region is about 0.5 μm or less and the doping dosage is 2E11 $cm^{-2}$, which are shown in FIG. 4 together with the simulation results ($BVD_{SS}$).

Figure 4:
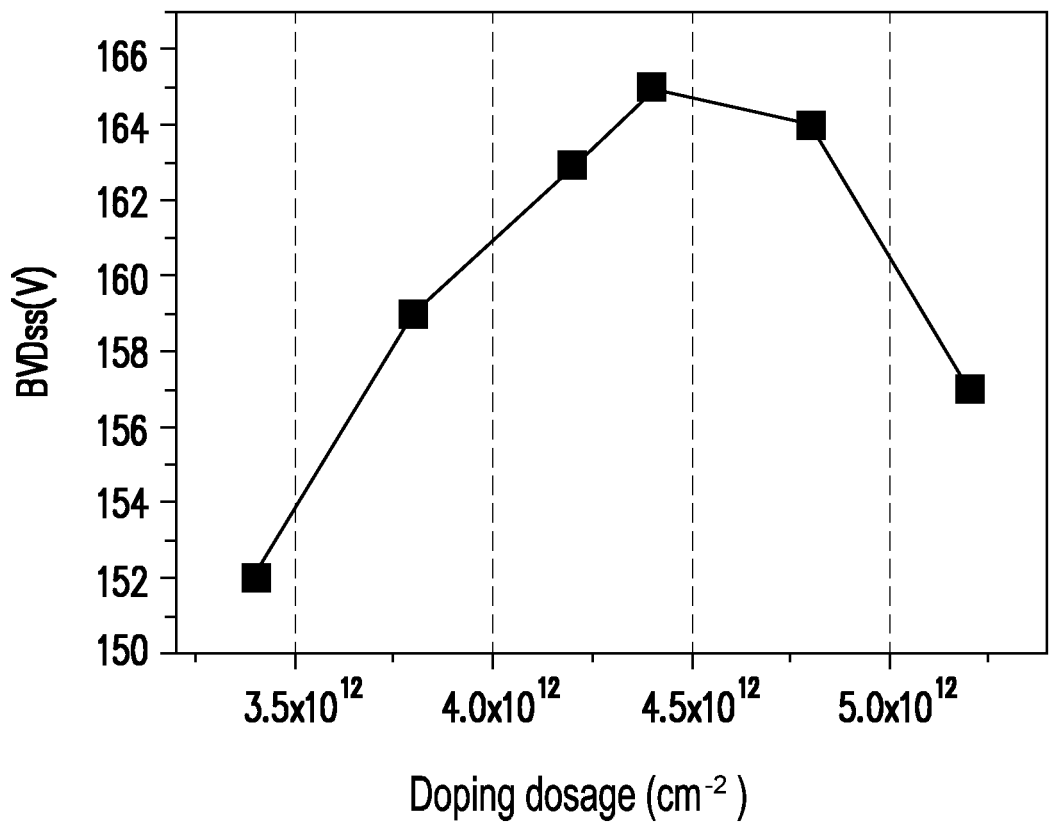
FIG. 4 is a graph of doping dosage and breakdown voltage of the second doped region of simulation experimental example 1.

As may be seen from FIG. 4, the structure of the disclosure has a breakdown voltage higher than 152 V; when the doping dosage of the first doped region is 4E12 $cm^{-2}$ to 5E12 $cm^{-2}$, the breakdown voltage thereof is higher than 160 V.

Simulation Control Example

The simulation was carried out in the same manner as in simulation experimental example 1, but there was no second doped region. That is to say, for example, the trench bottom in FIG. 1B only has the first doped region having a different conductivity type from the epitaxial layer, and has the doping dosage variation and simulation results shown in Table 1 below.

TABLE 1

| Doping dosage ($cm^{-2}$) | Power (KeV) | BVDss (V) |
|---|---|---|
| None | None | 120 V |
| $2.6 \times 10^{12}$ | 30/120/300 | 143 V |
| $2.6 \times 10^{12}$ | 30/120/300/500/700/900 | 141 V |
| $3.0 \times 10^{12}$ | 30/120/300/500/700/900 | 136 V |

It may be seen from Table 1 that the overall breakdown voltage would be reduced to 143 V or less in the absence of the second doped region.

Based on the above, in the disclosure, first and second doped regions having different conductivity types are formed in the epitaxial layer at the bottom of the shield gate MOSFET, second doped regions having the same conductivity type as the epitaxial layer are in direct contact with the trench bottom, and first doped regions having different conductivity types from the epitaxial layer provide a uniform field distribution below. Therefore, the leakage path of the device may be reduced by the second doped regions, thereby improving drain-source breakdown voltage.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for fabricating a shield gate MOSFET, comprising:

forming an epitaxial layer, wherein the epitaxial layer has a first conductivity type;

forming a plurality of trenches in the epitaxial layer, wherein a connecting region is defined in one end of each of the trenches;

forming a first doped region and a second doped region in the epitaxial layer at a bottom of each of the trenches, wherein the first doped region has a second conductivity type, and the second doped region has the first conductivity type;

forming an insulating layer on a surface of the epitaxial layer in each of the trenches;

forming a conductive layer on the insulating layer in each of the trenches;

forming a protective layer on the connecting region;

removing a portion of the conductive layer except for the connection region to form a shield gate, expose a portion of the insulating layer, and keep the conductive layer in the connection region;

removing the exposed portion of the insulating layer and expose a portion of the epitaxial layer in the trenches;

removing the protective layer;

rounding a top surface of the shield gate and a top surface of the conductive layer in the connecting region;

forming an inter-gate oxide layer and a gate oxide layer in the trenches, wherein the inter-gate oxide layer covers the rounded top surface of the shield gate, and the gate oxide layer covers a surface of the exposed portion of the epitaxial layer, wherein the inter-gate oxide layer or the gate oxide layer covers the rounded top surface of the conductive layer in the connecting region; and forming a control gate on the inter-gate oxide layer in the plurality of trenches.

2. The method for fabricating the shield gate MOSFET of claim 1, wherein the first conductivity type is N type and the second conductivity type is P type.

3. The method for fabricating the shield gate MOSFET of claim 1, wherein the first conductivity type is P type and the second conductivity type is N type.

4. The method for fabricating the shield gate MOSFET of claim 1, further comprising forming a source region on a surface of the epitaxial layer, and a doping concentration of the second doped region is less than a doping concentration of the source region.

5. The method for fabricating the shield gate MOSFET of claim 1, wherein a doping concentration of the first doped region is a uniform concentration.

* * * * *